United States Patent [19]

Lin et al.

[11] Patent Number: 5,485,035
[45] Date of Patent: Jan. 16, 1996

[54] METHOD FOR PLANARIZATION OF AN INTEGRATED CIRCUIT

[75] Inventors: Yih-Shung Lin, Carrollton; Kuei-Wu Huang, Irving; Lun-Tseng Lu, Grand Prairie, all of Tex.

[73] Assignee: SGS-Thomson Microelectronics, Inc., Carrollton, Tex.

[21] Appl. No.: 174,430

[22] Filed: Dec. 28, 1993

Related U.S. Application Data

[63] Continuation of Ser. No. 861,076, Mar. 31, 1992, abandoned.

[51] Int. Cl.⁶ .......................... H01L 23/48; H01L 29/46; H01L 29/54; H01L 29/62
[52] U.S. Cl. .............................. 257/637; 257/635
[58] Field of Search ...................... 257/635, 637, 257/650, 644, 641, 640, 649, 739

[56] References Cited

U.S. PATENT DOCUMENTS

| | | | |
|---|---|---|---|
| 3,860,836 | 1/1975 | Pederson | 257/635 |
| 4,613,888 | 9/1986 | Mase et al. | 257/637 |
| 4,676,867 | 6/1987 | Elkins et al. | |
| 5,130,782 | 7/1992 | Ashwell | 257/644 |

*Primary Examiner*—Sara W. Crane
*Assistant Examiner*—S. V. Clark
*Attorney, Agent, or Firm*—Kenneth C. Hill; Lisa K. Jorgenson; Richard K. Robinson

[57] ABSTRACT

A method for planarization of an integrated circuit. After a first conducting layer is deposited and patterned, a first insulating layer is deposited over the device. A planarizing layer is then deposited over the integrated circuit and etched back. Portions of the planarizing layer may remain in the lower topographical regions of the first insulating layer to planarize the surface of the device. A second insulating layer is then deposited over the integrated circuit, followed by a third insulating layer. A contact via is formed through the layers to expose a portion of the first conducting layer. A second conducting layer can now be deposited and patterned on the device to make electrical contact with the first conducting layer.

9 Claims, 2 Drawing Sheets

METHOD FOR PLANARIZATION OF AN INTEGRATED CIRCUIT

This is a continuation, of application Ser. No. 07/861,076 filed Mar. 31, 1992, abandoned.

BACKGROUND OF THE INVENTION

1. Field of the Invention

The present invention relates generally to the fabrication of semiconductor integrated circuits, and more specifically to a method for manufacturing integrated circuits having multilayers of metal interconnect lines.

2. Description of the Prior Art

By increasing the density of components in an integrated circuit, it is necessary to use multiple layers to fabricate the various components, and contacts between the layers to connect one layer to another. Fabricating the contacts and multiple layers, however, results in the creation of hills and valleys on the surface of the device. Those skilled in the art will recognize it is difficult to get upper interconnect layers to maintain constant cross sections when crossing over uneven topography. This can lead to step coverage problems, such as voids in the metal interconnect lines and contacts. Step coverage problems can also result in the metal interconnect lines having a higher current density. These defects can cause electromigration or other related device failure mechanisms.

Therefore, it would be desirable to provide a method for fabricating integrated circuits which alleviates step coverage problems and presents a planarized topography. It is also desirable that such a method not significantly increase the complexity of the manufacturing process.

SUMMARY OF THE INVENTION

According to the present invention, a method is provided for better planarization of an integrated circuit. After a first conducting layer is deposited and patterned, a first insulating layer is deposited over the device. A thick planarizing layer is then deposited over the integrated circuit and etched back. Portions of the planarizing layer may remain in the lower topographical regions of the first insulating layer to planarize the surface of the device. A second insulating layer is then deposited over the integrated circuit, followed by a third insulating layer. A contact via is formed through the layers to expose a portion of the first conducting layer. A second conducting layer can now be deposited and patterned on the device to make electrical contact with the first conducting layer.

BRIEF DESCRIPTION OF THE DRAWINGS

The novel features believed characteristic of the invention are set forth in the appended claims. The invention itself however, as well as a preferred mode of use, and further objects and advantages thereof, will best be understood by reference to the following detailed description of an illustrative embodiment when read in conjunction with the accompanying drawings, wherein:

DESCRIPTION OF THE PREFERRED EMBODIMENT

The process steps and structures described below do not form a complete process flow for manufacturing integrated circuits. The present invention can be practiced in conjunction with integrated circuit fabrication techniques currently used in the art, and only so much of the commonly practiced process steps are included as are necessary for an understanding of the present invention. The figures representing cross-sections of portions of an integrated circuit during fabrication are not drawn to scale, but instead are drawn so as to illustrate the important features of the invention.

Figure 1:
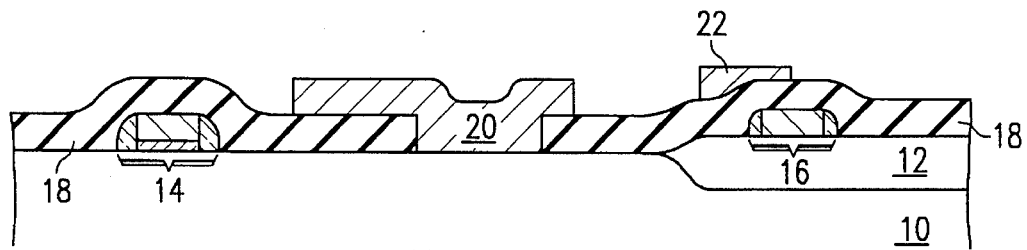
FIGS. 1–7 are sectional views of an integrated circuit illustrating a preferred method for planarization of an integrated circuit according to the present invention.

With reference to FIG. 1, an integrated circuit will be built on a substrate 10. Field oxide region 12 is formed to isolate the active areas within the substrate 10. Gate electrodes 14, 16 are formed on the device using methods known in the art, followed by the deposition of a first insulating layer 18. The first insulating layer 18 is typically made of oxide and has a thickness of approximately 5000 angstroms. The first insulating layer be is patterned to expose a portion of the substrate 10, and conductive interconnect 20 is then formed in the opening to make electrical contact with the substrate 10. Conductive interconnect 22 is formed on the first insulating layer 18. Conductive interconnects 20, 22 can be made from metal or polycrystalline silicon.

Figure 2:
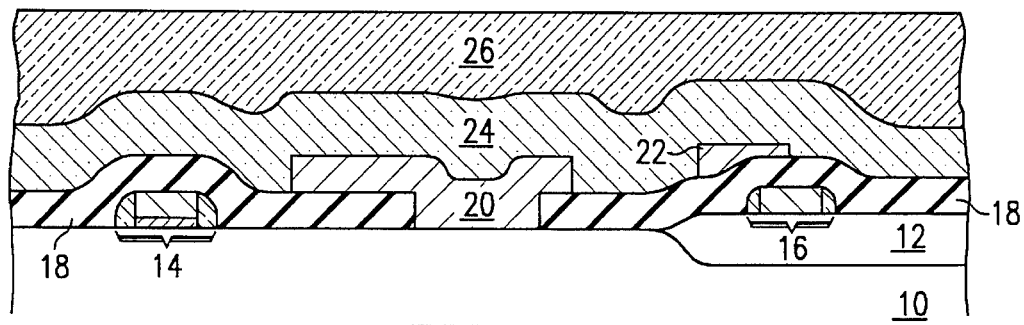

Referring to FIG. 2, a second insulating layer 24 is deposited over the integrated circuit. The second insulating layer 24 is preferably made from boron doped oxide, but can consist of other insulating materials, depending upon which etch back process and via formation process are used. As known in the art, boron doped oxide is conformal to its underlying structures, which allows it to fill in and adhere to sidewalls and lower topographical areas on the integrated circuit. A planarizing layer 26 is then deposited over the second insulating layer 24. The planarizing layer 26 is preferably made from spin on glass, and has a thickness of approximately 5500 angstroms. The thick coating of spin on glass will planarize the surface of the integrated circuit.

Figure 3:
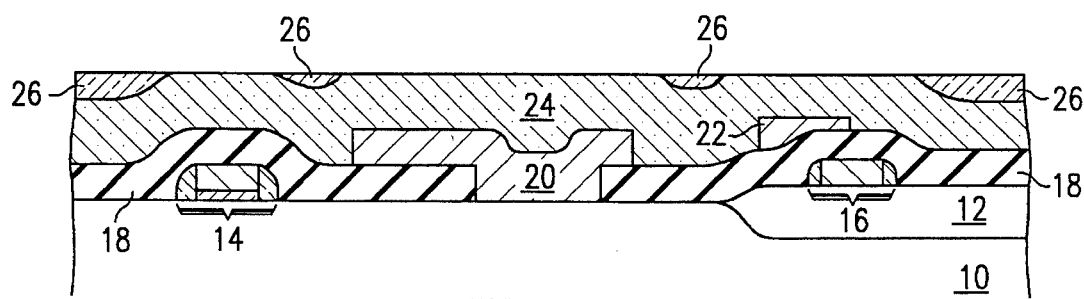

FIG. 3 illustrates the integrated circuit after an anisotropic etch is performed to remove portions of the planarizing layer 26. As known in the art, the second insulating layer 24 helps to minimize the loading effects created during the etchback. As can be seen, portions of the planarizing layer 26 may remain in the lower topographical regions of the second insulating layer 24, creating a planarized surface. Alternatively, planarizing layer 26 can be completely etched away so that the second insulating layer 24 planarizes the surface of the integrated circuit.

Figure 4:
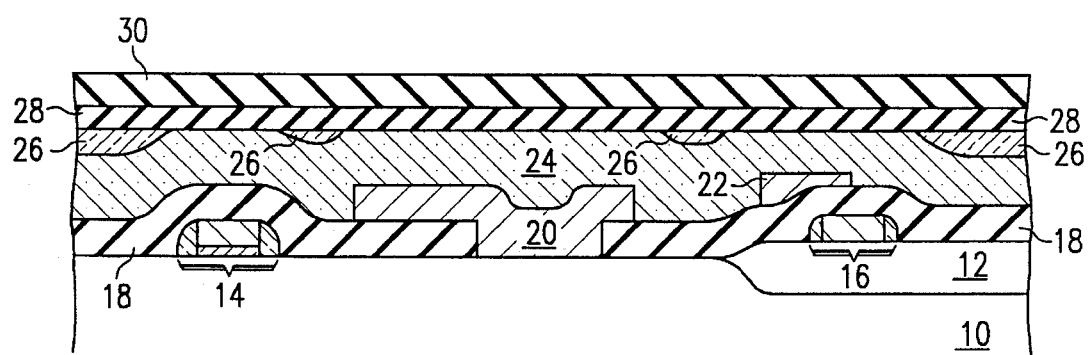

Referring to FIG. 4, a third insulating layer 28 is deposited over the device. The third insulating layer 28 is preferably made of boron doped oxide, and has a thickness of approximately 1500 angstroms. A fourth insulating layer 30 is then deposited over the third insulating layer 28. The fourth insulating layer 30 is preferably made of undoped oxide, and has a thickness of approximately 4000 angstroms.

Figure 5:
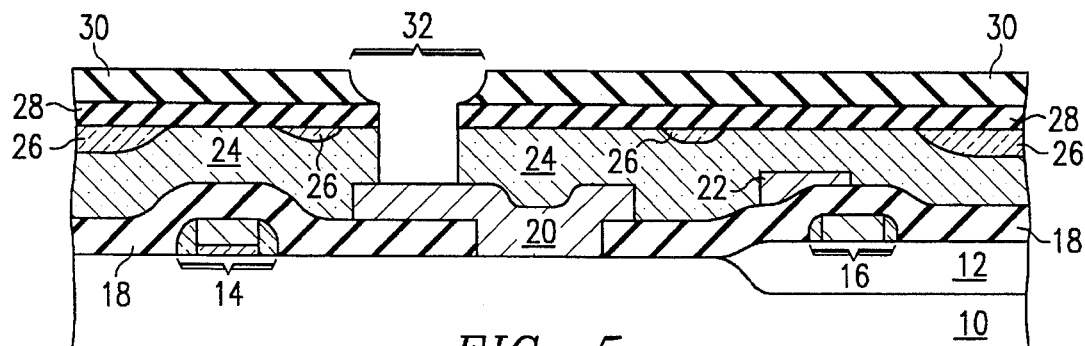

FIG. 5 illustrates the device after a contact via 32 is formed through the layers to expose a portion of the metal interconnect 20. The contact via 32 is preferably created by first performing an isotropic etch through the fourth insulating layer 30. During this process, the third insulating layer 28 acts as an etch stop and protects the underlying layers from damage during the isotropic etch. To complete formation of the contact via 32, an anisotropic etch is performed through the remaining layers to expose a portion of the metal interconnect 20. Alternatively, an anisotropic etch can be performed to create the contact via 32.

Figure 6:
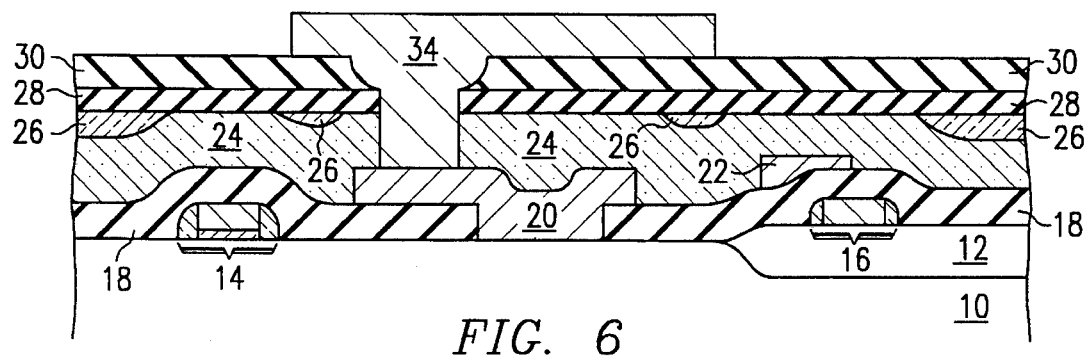

Referring to FIG. 6, a second metal interconnect layer 34 is deposited and patterned on portions of the fourth insulating layer 30 and extends into the contact via 32 to make electrical contact with the metal interconnect 20. The integrated circuit is now ready for further processing steps.

Figure 7:
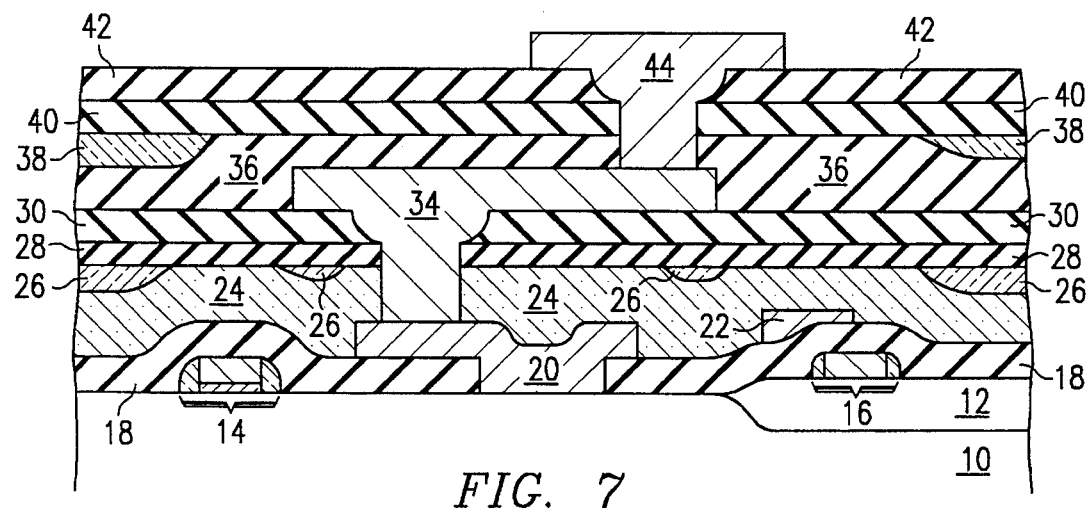

FIG. 7 illustrates the integrated circuit after the processing steps described in connection with FIGS. 2-6 are repeated. As shown, a fifth insulating layer 36 similar to the second insulating layer 24 is deposited over the device and covers the second metal interconnect 34. A layer of planarizing material has been deposited over the fifth insulating layer (not shown) and etched back creating pockets of planarizing material 38. A sixth insulating layer 40 similar to the third insulating layer 28 is deposited over the device, followed by a seventh insulating layer 42. The seventh insulating layer 42 is similar to the fourth insulating layer 30. A contact via is formed as described with reference to FIG. 5, and a third metal interconnect 44 is created in the contact via. The third metal interconnect 44 is formed by depositing and patterning a metal such that electrical contact is made between metal interconnect layers 34 and 44.

As described above, the present invention provides a method for improved planarization of the surface of an integrated circuit. The advantages of this method include the ability to form contact vias by performing an isotropic etch followed by a anisotropic etch. Moreover, underlying layers are protected during formation of the contact vias through the use of an etch stop. The boron doped oxide also has excellent conformality and adheres to the sidewalls and fills in the lower portion of the contact vias. Consequently, reduced amounts of planarizing material are required to planarize the surface of the integrated circuit. Finally, this method does not significantly increase the complexity of the manufacturing process.

While the invention has been particularly shown and described with reference to a preferred embodiment, it will be understood by those skilled in the art that various changes in form and detail may be made therein without departing from the spirit and scope of the invention.

What is claimed is:

1. A structure in an integrated circuit, comprising:
   a first conductive layer defining an interconnect layer;
   a first insulating layer overlying the integrated circuit, wherein an upper surface of the first insulating layer is non-planar and contains lower topographical regions;
   a plurality of planarizing material regions on the first insulating layer, wherein the planarizing material regions fill in the lower topographical regions thereof to form a substantially planar upper surface, wherein no planarizing material regions lie above a selected portion of the first conductive layer;
   a layer of insulating material overlying the first insulating layer and the planarizing material regions;
   an opening through the layer of insulating material and the first insulating layer exposing the selected portion of the first conductive layer; and
   a second conductive layer overlying portions of the layer of insulating material and extending into the opening to make electrical contact with the first conductive layer, wherein the layer of insulating material is a multi layer comprising:
      a second insulating layer overlying the integrated circuit; and
      a third insulating layer overlying the second insulating layer, wherein the third insulating layer is formed from a material which can be selectively etched over the second insulating layer.

2. The structure of claim 1, wherein the second insulating layer is made of boron doped oxide.

3. The structure of claim 1, wherein the third insulating layer is made of undoped oxide.

4. The structure of claim 1, wherein the second conductive layer is made of a metal.

5. A structure in an integrated circuit, comprising:
   a first conductive layer defining an interconnect layer;
   a first insulating layer overlying the integrated circuit, wherein the surface of the first insulating layer has lower and higher topographical regions, and wherein planarizing material regions fill in the lower topographical regions of the first insulating layer so that an upper surface of the first insulating layer is substantially coplanar with upper surfaces of the planarizing material regions, wherein the first insulating layer upper surface and the planarizing material region upper surfaces form a substantially planar surface, and wherein no planarizing material regions lie above a selected portion of the first conductive layer;
   a layer of insulating material overlying the first insulating layer and the planarizing material regions;
   an opening through the layer of insulating material and the first insulating layer exposing the selected portion of the first conductive layer; and
   a second conductive layer overlying portions of the layer of insulating material and extending into the opening to make electrical contact with the first conductive layer, wherein the layer of insulating material is a multi-layer, comprising:
      a second insulating layer overlying the first insulating layer; and
      a third insulating layer overlying the second insulating layer, wherein the third insulating layer is formed from a material which can be selectively etched over the second insulating layer.

6. The structure of claim 5, wherein the second insulating layer is made of boron doped oxide.

7. The structure of claim 5, wherein the third insulating layer is made of undoped oxide.

8. The structure of claim 1, wherein the opening extends vertically through the first and second insulating layers, and wherein the opening has rounded upper corners within the third insulating layer.

9. The structure of claim 5, wherein the opening extends vertically through the first and second insulating layers, and wherein the opening has rounded upper corners within the third insulating layer.

* * * * *